(12) United States Patent
Song et al.

(10) Patent No.: US 8,664,037 B2
(45) Date of Patent: Mar. 4, 2014

(54) METHOD FOR FORMING PATTERN OF METAL OXIDE AND METHOD FOR MANUFACTURING THIN FILM TRANSISTOR USING THE SAME

(75) Inventors: Yong-Won Song, Seoul (KR); Jae-Min Hong, Seoul (KR); Jung Ah Lim, Chungcheongnam-do (KR); Hak-Sung Kim, Seoul (KR); Seong-Ji Kwon, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 70 days.

(21) Appl. No.: 13/527,741

(22) Filed: Jun. 20, 2012

(65) Prior Publication Data

US 2012/0329209 A1    Dec. 27, 2012

(30) Foreign Application Priority Data

Jun. 21, 2011    (KR) .................. 10-2011-0060243

(51) Int. Cl.
*H01L 21/00*    (2006.01)

(52) U.S. Cl.
USPC .................. 438/104; 106/31.47; 106/31.49; 106/31.6; 106/31.9; 347/54; 347/73; 347/86; 257/E21.174

(58) Field of Classification Search
None
See application file for complete search history.

(56) References Cited

U.S. PATENT DOCUMENTS

2006/0117994 A1*   6/2006   Ryu et al. .................. 106/31.58

FOREIGN PATENT DOCUMENTS

| JP | 2008-547237 A | 12/2008 |
| KR | 1020080030454 A | 4/2008 |
| KR | 1020100136553 A | 12/2010 |
| WO | 2007/044098 A1 | 4/2007 |
| WO | 2009/133500 A1 | 11/2009 |

* cited by examiner

*Primary Examiner* — Kyoung Lee
(74) *Attorney, Agent, or Firm* — Ladas & Parry LLP

(57) ABSTRACT

Disclosed are a method for forming a metal oxide pattern and a method of manufacturing a thin film transistor using the patterned metal oxide. The method for forming a metal oxide pattern includes: preparing an ink composition including at least one metal oxide precursor or metal oxide nanoparticle, and a solvent; ejecting the ink composition on a substrate to form a pattern on the substrate; and photosintering the formed pattern. Herein, the metal oxide precursor is ionic.

19 Claims, 5 Drawing Sheets

(a)

(b)

METHOD FOR FORMING PATTERN OF METAL OXIDE AND METHOD FOR MANUFACTURING THIN FILM TRANSISTOR USING THE SAME

CROSS-REFERENCE TO RELATED APPLICATION

This application claims priority to and the benefit of Korean Patent Application No. 10-2011-0060243 filed in the Korean Intellectual Property Office on Jun. 21, 2011, the entire contents of which are incorporated herein by reference.

BACKGROUND OF THE INVENTION (a) Field of the Invention

A method for forming a metal oxide pattern and a method of manufacturing a thin film transistor using the same are disclosed.

(b) Description of the Related Art

A transistor is widely used as a switching device or a driving device for an electronic device. In particular, a metal oxide-based thin film transistor is being paid much attention because of its mobility, stability, and transparency. However, the metal oxide-based thin film transistor is expected to be produced without vacuum equipment at room temperature with a low cost in order to be more variously applied in a related field.

Accordingly, there is wide research in the electronic printing field related to the metal oxide-based thin film transistor. In the electronic printing field, an electronic device is fabricated in a printing method by using various inks such as a metal ink for an electrode, a conductive wire, or the like, a semiconductor ink for a semiconductor layer, a dielectric material ink for a dielectric layer, and a protective ink for protecting a device or a particular layer.

Among these inks, a semiconductor ink is conventionally used to fabricate an active layer for a thin film transistor whose crystal structure should be re-arranged by a sintering method. However, this sintering method is very limiting when applied to a soft electron device.

In addition, a metal oxide ink is printed and sintered to fabricate the semiconductor layer and/or dielectric layer. Herein, the metal oxide ink needs to be sintered at a high enough temperature to flow, which may damage a substrate and thus have a bad influence on the structure and operation characteristics of a device.

In order to ameliorate the drawback of the conventional sintering method, a laser sintering method has been introduced to treat only a layer on a substrate without damaging the substrate by controlling power, wavelength, or the like of a laser.

However, the laser sintering method still has some drawbacks of being applied to a very limited area, requiring non-economical laser equipment, and being inefficiently controlled. Accordingly, development of a new sintering method is increasingly demanded.

SUMMARY OF THE INVENTION

An exemplary embodiment of the present invention provides a method of forming a metal oxide pattern and manufacturing a thin film transistor using the metal oxide pattern.

Another embodiment of the present invention provides a method for forming a metal oxide pattern which includes: preparing an ink composition including at least one metal oxide precursor or one metal oxide nanoparticle, and a solvent; ejecting the ink composition onto a substrate to form a pattern thereon; and photosintering the formed pattern, wherein the metal oxide precursor may be ionic.

The formed pattern may be additionally preheated at a temperature ranging from about 50 to about 400° C. before photosintering the formed pattern.

The ink composition may include the metal oxide nanoparticle.

The ink (for example, ion ink) composition may further include a solution stabilizer.

The solution stabilizer may be diketone, amino alcohol, polyamine, ethanol amine, diethanol amine, or a combination thereof.

The solvent may be water, tetrahydrofuran (THF), an alcohol-based solvent, an ether-based solvent, or a combination thereof.

The metal oxide precursor may be a metal inorganic salt including a metal selected from lithium (Li), sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), bismuth (Bi), and a combination thereof.

The metal inorganic salt may include an anion selected from a hydroxide ion, an acetate ion, a propionate ion, an acetylacetonate ion, a 2,2,6,6-tetramethyl-3,5-heptanedionate ion, a methoxide ion, a sec-butoxide ion, a t-butoxide ion, an n-propoxide ion, an i-propoxide ion, an ethoxide ion, a phosphate ion, an alkylphosphate ion, a nitrate ion, a perchlorate ion, a sulfate ion, an alkylsulfonate ion, a phenoxide ion, a bromide ion, an iodide ion, a chloride ion, and a combination thereof.

The ink composition may further include a polymer binder.

The polymer binder may include poly(vinylpyrrolidone) (PVP), polyacrylate, polyethylene glycol, cellulose acetate, or a combination thereof.

The metal oxide nanoparticle may include a metal selected from lithium (Li), sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), bismuth (Bi), and a combination thereof.

The photosintering may be performed by using a short-pulsed white light.

The short-pulsed white light may last for about 1 to about 500 ms and pause for about 0.1 to about 500 ms, the pulse number ranges from about 1 to about 99, or the pulse energy ranges from about 5 to about 200 J/cm$^2$.

According to another embodiment of the present invention, provided is a method of manufacturing a thin film transistor which includes: depositing a gate dielectric layer on a gate electrode and a substrate; depositing an oxide semiconductor layer on the gate dielectric layer; depositing a conductive layer on the oxide semiconductor layer; and etching the conductive layer to define source and drain electrodes and an active channel. The deposition of an oxide semiconductor layer on a gate dielectric layer includes: preparing a first ink composition including at least one first metal oxide precursor or one first metal oxide nanoparticle, and a first solvent; ejecting the first ink composition onto the gate dielectric layer to form a semiconductor layer thereon; and photosintering the formed oxide semiconductor layer, and the first metal oxide precursor may be ionic.

The deposition of a gate dielectric layer on a gate electrode and a substrate may include: preparing a second ink composition including at least one second metal oxide precursor or one second metal oxide nanoparticle, and a second solvent; ejecting the second ink composition onto a gate electrode and a substrate and forming a gate dielectric layer thereon; and photosintering the gate dielectric layer, and the second metal oxide precursor may be ionic.

The gate dielectric layer may be additionally preheated at a temperature ranging from about 50 to about 400° C. on the gate dielectric layer before the photosintering.

In addition, the oxide semiconductor layer may be additionally preheated at a temperature ranging from about 50 to about 400° C. on the gate dielectric layer before the photosintering.

The first ink composition may include the first metal oxide nanoparticle, and the second ink composition may include the second metal oxide nanoparticle.

The photosintering of the gate dielectric layer or the oxide semiconductor layer may be performed using a short-pulsed white light.

According to one embodiment of the present invention, a metal oxide ink may be sintered for a short time such as milliseconds under the atmosphere using a short-pulsed white light. In addition, this sintering may minimize damage to a substrate.

The sintered thin film layer may be applied to a channel layer and a dielectric layer for an active device.

The sintering method may provide an electronic device, and in particular, a flexible electronic device.

DETAILED DESCRIPTION

Figure 1:
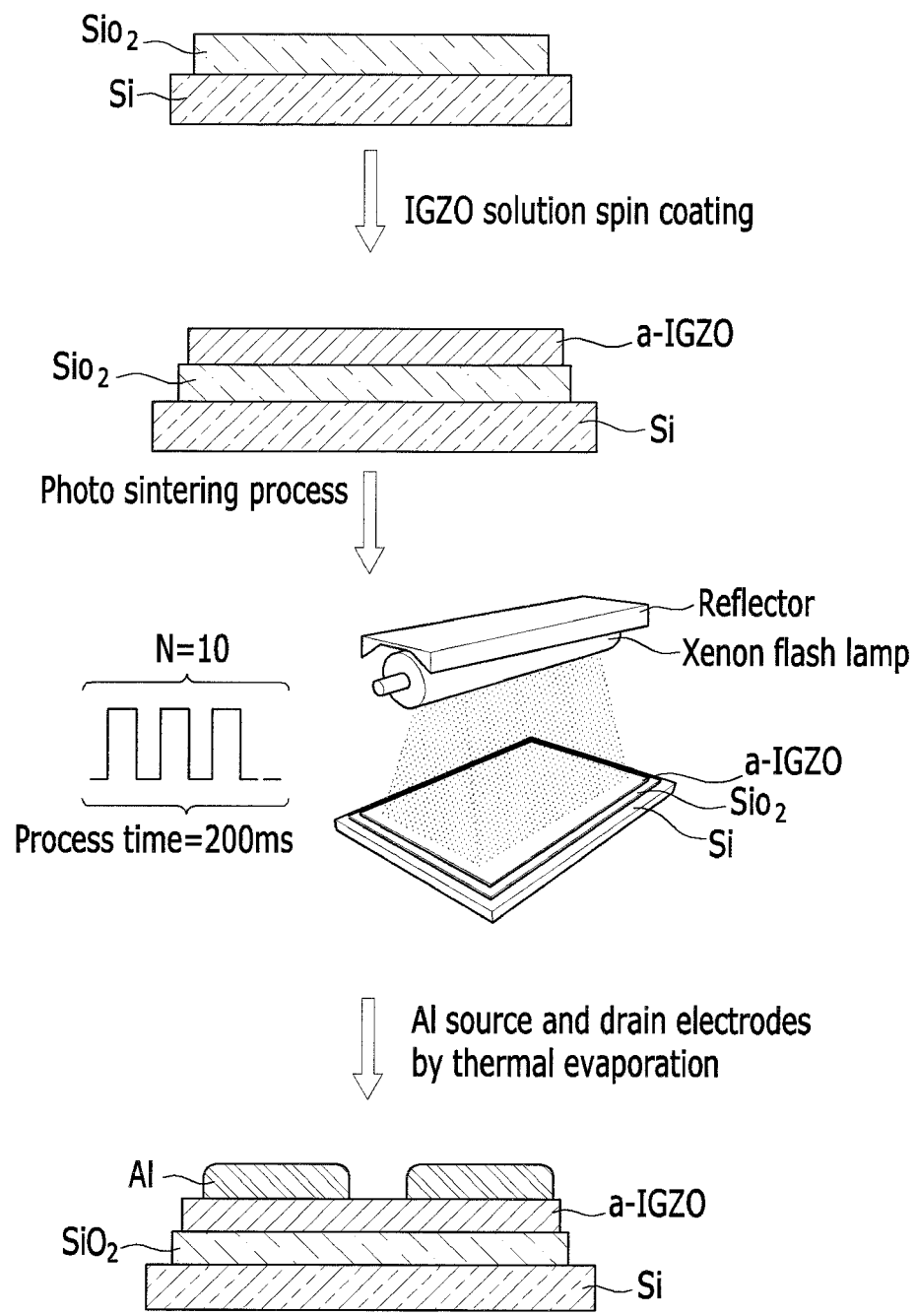
FIG. 1 shows a process of manufacturing a thin film transistor according to Example 2.

Exemplary embodiments will hereinafter be described in detail. However, these embodiments are exemplary, and this disclosure is not limited thereto.

According to one embodiment of the present invention, provided is a method for forming a metal oxide pattern which includes: preparing an ink composition including at least one metal oxide precursor or metal oxide nanoparticle and a solvent; ejecting the ink composition on a substrate to form a pattern on the substrate; and photosintering the formed pattern, wherein the metal oxide precursor is ionic.

The method for forming a metal oxide pattern is a continuous process and may be applied to a device with a large area. In addition, the photosintering may minimize damage to a substrate and may be more effectively applied to a soft substrate. Furthermore, a metal oxide may be sintered a short time of less than or equal to a millisecond during the photosintering.

The method for forming a metal oxide pattern may be performed at room temperature under the ambient atmosphere, and the real industrial application range is wide.

The pattern may be a common layer or a predetermined pattern. The pattern may vary depending on a purpose of use.

In order to photosinter a metal oxide as aforementioned, the ink composition may be ionic. An ion-type ink includes a polymer and thus may usefully absorb light with various spectra. In addition, the metal oxide in general needs to be controlled regarding thickness to form a thin layer for an electronic device, to which an ionic ink may be effectively applied.

The ionic metal oxide precursor may be a metal inorganic salt including a metal selected from lithium (Li), sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), bismuth (Bi), and a combination thereof.

The metal inorganic salt may include an anion selected from a hydroxide ion, an acetate ion, a propionate ion, an acetylacetonate ion, a 2,2,6,6-tetramethyl-3,5-heptanedionate ion, a methoxide ion, a sec-butoxide ion, a t-butoxide ion, an n-propoxide ion, an i-propoxide ion, an ethoxide ion, a phosphate ion, an alkylphosphate ion, a nitrate ion, a perchlorate ion, a sulfate ion, an alkylsulfonate ion, a phenoxide ion, a bromide ion, an iodide ion, a chloride ion, and a combination thereof.

The ink composition includes the ionic metal oxide precursor as the metal salt and thus may effectively absorb light with various spectra.

When the ink composition includes the ion-type metal oxide precursor, the ink composition may further include a solution stabilizer.

The solution stabilizer may include diketone, amino alcohol, polyamine, ethanol amine, diethylnol amine, or a combination thereof, but is not limited thereto.

The ink composition may include a metal oxide nanoparticle. The metal oxide nanoparticle may have a size ranging from about 1 to about 50 nm. The metal oxide nanoparticle may be mixed in the ion ink composition in a determined ratio depending on a desired purpose.

The metal oxide nanoparticle may include a metal selected from lithium (L) sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), bismuth (Bi), and a combination thereof.

The metal oxide nano particle may include at least one material selected from InGaZnO, ZnO, ZrInZnO, InZnO, ZnO, InGaZnO$_4$, ZnInO, ZnSnO, In$_2$O$_3$, Ga$_2$O$_3$, HfInZnO, GaInZnO, HfO$_2$, SnO$_2$, WO$_3$, TiO$_2$, Ta$_2$O$_5$, In$_2$O$_3$SnO$_2$, MgZnO, ZnSnO$_3$, ZnSnO$_4$, CdZnO, CuAlO$_2$, CuGaO$_2$, Nb$_2$O$_5$, Al$_2$O$_3$, TiSrO$_3$ and a combination thereof.

The solvent may include water, tetrahydrofuran (THF), an alcohol-based solvent, an ether-based solvent, or a combination thereof, but is not limited thereto. The alcohol-based solvent may be 4-methoxy ethanol.

The ink composition including the metal oxide nanoparticle may further include a polymer binder.

The polymer binder may include poly(vinylpyrrolidone) (PVP), polyacrylate, polyethylene glycol, cellulose acetate, or a combination thereof.

The formed pattern may be preheated at a temperature ranging from about 50 to about 400° C. before photosintering the formed pattern.

The preheat treatment may be performed at a temperature ranging from about 50 to about 200° C., and in particular, about 200 to about 400° C. A temperature for the preheat treatment may be determined depending on a used ink composition, but is not limited to the aforementioned range.

The preheat treatment may maximize sintering effects in the following photosintering step.

The photosintering may be performed by using a short-pulsed white light.

The short-pulsed white light may last for about 1 to about 500 ms.

The short-pulsed white light may be paused for about 0.1 to about 500 ms.

The short-pulsed white light may have pulse energy ranging from about 5 to about 200 J/cm$^2$.

The short-pulsed white light may have the pulse number ranging from about 1 to about 99.

The aforementioned conditions for the short-pulsed white light may be changed depending on desired effects, but are not limited thereto.

The photosintering the formed pattern may be performed by a short-pulsed white light-sintering system.

The short-pulsed white light-sintering system may include a plurality of xenon flash lamps or a short xenon flash lamp, a triggering/controlling circuit, a capacitor, a reflector, a photowavelength filter, and the like.

In addition, the short-pulsed white light-sintering system may include a vertical distance controller to regulate a distance between a xenon flash lamp and a substrate. Furthermore, the short-pulsed white light-sintering system includes a flat substrate transporter such as a conveyor belt, and thus may be a system in real time.

The conveyor belt is internally equipped with an assistant heater and a cooler, and thus may improve efficiency and quality of the sintering process.

On the other hand, a lamp housing for a xenon flash lamp is equipped with a quartz tube and a path for supplying cold water to cool the xenon flash lamp along with a separate cooler.

In addition, a wavelength filter may be equipped to selectively filter a predetermined wavelength region, and may vary depending on the kinds of a particle and a substrate and the size of the particle.

A beam guide made of quartz may be equipped to precisely control the passage of light. This beam guide may desirably regulate several conditions of a light pulse such as pulse duration, pulse off-time, pulse number, pulse peak intensity, average pulse energy, and the like.

The photosintered pattern may be analyzed regarding component, shape, electrical conductivity, and the like using a scanning electron microscope (SEM), a focused ion beam (FIB), energy dispersive spectroscopy (EDS), an X-ray diffraction (XRD) analyzer, a semiconductor analyzer (SA), and the like.

According to another embodiment of the present invention, provided is method of manufacturing a thin film transistor, which includes: depositing a gate dielectric layer on a gate electrode and a substrate; depositing an oxide semiconductor layer on the gate dielectric layer; depositing a conductive layer on the oxide semiconductor layer; and etching the conductive layer to define source and drain electrodes and an active channel. The deposition of an oxide semiconductor layer on the gate dielectric layer may include: preparing a first ink composition including at least one first metal oxide precursor or one first metal oxide nanoparticle, and a first solvent; ejecting the first ink composition on the gate dielectric layer to form a semiconductor layer thereon; and photosintering the oxide semiconductor layer, wherein the first metal oxide precursor may be ionic.

The deposition of a gate dielectric layer on a gate electrode and a substrate may include: preparing a second ink composition including at least one second metal oxide precursor or one second metal oxide nanoparticle, and a second solvent; ejecting the second ink composition on the gate electrode and the substrate and forming a gate dielectric layer on the gate electrode and the substrate; and photosintering the gate dielectric layer, wherein the second metal oxide precursor is ionic.

The first metal oxide precursor and the second metal oxide precursor are the same or different, and may independently be a metal oxide precursor used in the aforementioned method for forming a metal oxide pattern according to one embodiment of the present invention.

The first metal oxide nanoparticle and the second metal oxide nanoparticle are the same or different, and may independently be a metal oxide nanoparticle used in the method for forming a metal oxide pattern according to one embodiment of the present invention.

The first and second solvents are the same or different, and may independently be a solvent used in the method for forming a metal oxide pattern according to one embodiment of the present invention.

The thin film transistor may be one of various substrates such as a plastic substrate, a silicon substrate, or the like, which is in general used to fabricate a semiconductor device.

On the substrate, a gate electrode may be formed. The gate electrode may include an electrically conductive layer controlling movement of charge carriers in a thin film transistor. The gate electrode may include a metal such as aluminum, tungsten, chromium, tantalum, or a combination thereof. The gate electrode may be fabricated in a conventional deposition method such as sputtering, lithography, and etching. The gate electrode may be fabricated by blanket-depositing a conductive layer on a substrate. The conductive layer may be sputtered and deposited. Then, a photoresist layer may be deposited on the conductive layer. The photoresist layer may be photocured and thermally cured, and then patterned. The gate electrode may be fabricated by etching the unmasked part of a conductive layer, so that the gate electrode may be left on a substrate.

On the gate electrode, a gate dielectric layer may be deposited. The gate dielectric layer may have an influence on the sub-threshold swing or the slope and the threshold voltage of a thin film transistor. As for a silicon-based thin film transistor (i.e., a thin film transistor including a silicon-based semiconductor layer such as amorphous silicon), a gate dielectric layer therein may not include a silicon oxide. Accordingly, the thin film transistor may have very positive Vth and low mobility.

However, a metal oxide thin film transistor may include a silicon oxide as an effective gate dielectric layer. The oxygen in the silicon oxide may not change a metal oxide layer or its interface, and thus causes no damage to the thin film transistor.

Specifically, the gate dielectric layer may include silicon nitride, silicon oxide, silicon dioxide, silicon oxy-nitride, aluminum oxide ($Al_2O_3$), and the like.

The gate dielectric layer may be formed of a metal oxide in the same method as the aforementioned method of forming a metal oxide pattern according to one embodiment of the present invention. However, it has a layer pattern.

The method of forming a gate dielectric layer is the same as the aforementioned method for forming a metal oxide pattern, and thus description thereof will be omitted.

Next, a semiconductor layer may be formed on the gate dielectric layer.

The semiconductor layer may be formed of a metal oxide in the same method as the aforementioned method for forming a metal oxide pattern according to one embodiment of the present invention. However, it has a layer pattern.

The method of forming a semiconductor layer is the same as the aforementioned method for forming a metal oxide pattern, and thus description thereof will be omitted.

On the semiconductor layer, a conductive layer may be deposited. Specifically, the conductive layer may include aluminum, tungsten, molybdenum, chromium, tantalum, and a combination thereof. The conductive layer may be sputtered for deposition.

The conductive layer may be partly etched to define a source electrode, a drain electrode, and an active channel.

Herein, the semiconductor layer may be partly removed through the etching.

In addition, an etching stopping layer may be deposited on the semiconductor layer before depositing the conductive layer. The etching stopping layer protects an active channel from excessive plasma exposure during the etching.

The semiconductor layer may include at least one selected from the following metal oxides:

$ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, or $SnInCdGaO_xN_y$.

The x may be in a range of $0 \leq x \leq 1$, and the y may be in a range of $0 \leq y \leq 1$.

The semiconductor layer may include the following doped materials:

$ZnO_xN_y$:Al, $ZnO_xN_y$:Sn, $SnO_xN_y$:Al, $InO_xN_y$:Al, $InO_xN_y$:Sn, $CdO_xN_y$:Al, $CdO_xN_y$:Sn, $GaO_xN_y$:Al, $GaO_xN_y$:Sn, $ZnSnO_xN_y$:Al, $ZnInO_xN_y$:Al, $ZnInO_xN_y$:Sn, $ZnCdO_xN_y$:Al, $ZnCdO_xN_y$:Sn, $ZnGaO_xN_y$:Al, $ZnGaO_xN_y$:Sn, $SnInO_xN_y$:Al, $SnCdO_xN_y$:Al, $SnGaO_xN_y$:Al, $InCdO_xN_y$:Al, $InCdO_xN_y$:Sn, $InGaO_xN_y$:Al, $InGaO_xN_y$:Sn, $CdGaO_xN_y$:Al, $CdGaO_xN_y$:Sn, $ZnSnInO_xN_y$:Al, $ZnSnCdO_xN_y$:Al, $ZnSnGaO_xN_y$:Al, $ZnInCdO_xN_y$:Al, $ZnInCdO_xN_y$:Sn, $ZnInGaO_xN_y$:Al, $ZnIn-GaO_xN_y$:Sn, $ZnCdGaO_xN_y$:Al, $ZnCdGaO_xN_y$:Sn, $SnInCdO_xN_y$:Al, $SnInGaO_xN_y$:Al, $SnCdGaO_xN_y$:Al, $InCdGaO_xN_y$:Al, $InCdGaO_xN_y$:Sn, $ZnSnInCdO_xN_y$:Al, $ZnSnInGaO_xN_y$:Al, $ZnInCdGaO_xN_y$:Al, $ZnInCdGaO_xN_y$:Sn, or $SnInCdGaO_xN_y$:Al.

The x may be in a range of $0 \leq x \leq 1$ and the y may be in a range of $0 \leq y \leq 1$.

Hereinafter, the embodiments of the present invention are illustrated in more detail with reference to examples. However, the following embodiments are exemplary but are not limiting.

Example 1

Preparation of Ink Composition

An InGaZnO (hereinafter, referred to as IGZO) ion ink composition is prepared to have the following composition.

$In(NO_3)_3 \cdot 3H_2O$, $Ga(NO_3)_3 \cdot 3H_2O$, and a metal oxide precursor including $Zn(OCOCH_3)_2 \cdot 2H_2O$ are mixed in a mole ratio of 2:1:1 with a 4-methoxy methanol anhydrous solvent.

Example 2

Fabrication of Thin Film Transistor

FIG. 1 shows a process of preparing a thin film transistor according to Example 2. The process of preparing a thin film transistor according to Example 2, as shown in FIG. 1, is one exemplary embodiment of the present invention but is not limited thereto.

The thin film transistor has a bottom gate structure in which a gate is positioned beneath a channel layer and a gate dielectric layer.

First of all, a Si wafer (i.e., an n-type wafer) doped with P (phosphorus) is used as a substrate. The $SiO_2$ dielectric material layer formed on the substrate is prepared as a gate dielectric material layer. In the Si wafer laminated with $SiO_2$, a wafer itself plays a role of a gate.

Next, the ink composition according to Example 1 is ejected onto the gate dielectric layer to form a semiconductor layer thereon in an inkjet method.

Then, the semiconductor layer is heat-treated at 80° C. for 10 minutes to remove an organic solvent in the semiconductor layer. The heat-treated semiconductor layer is photosintered under the following conditions.

Herein, a xenon lamp which has about 10 pulses, lasts for 10 ms, and is paused for 10 ms is used. The xenon lamp is applied with a voltage of about 430 V and has entire pulse energy of about 90±5 $J/cm^2$. The photosintering is performed within about 200 ms in total.

Then, an Al electrode is deposited on the semiconductor layer, so that it may be used as source and drain electrodes. The Al electrode is etched to define source and drain electrodes.

Comparative Example 1

Fabrication of Thin Film Transistor

A thin film transistor is fabricated according to the same method as Example 2, except for heat-treating a semiconductor layer at about 500° C. for about 1 hour instead of the photosintering.

Experimental Example

SEM Photograph of Semiconductor Layer

Figure 2:
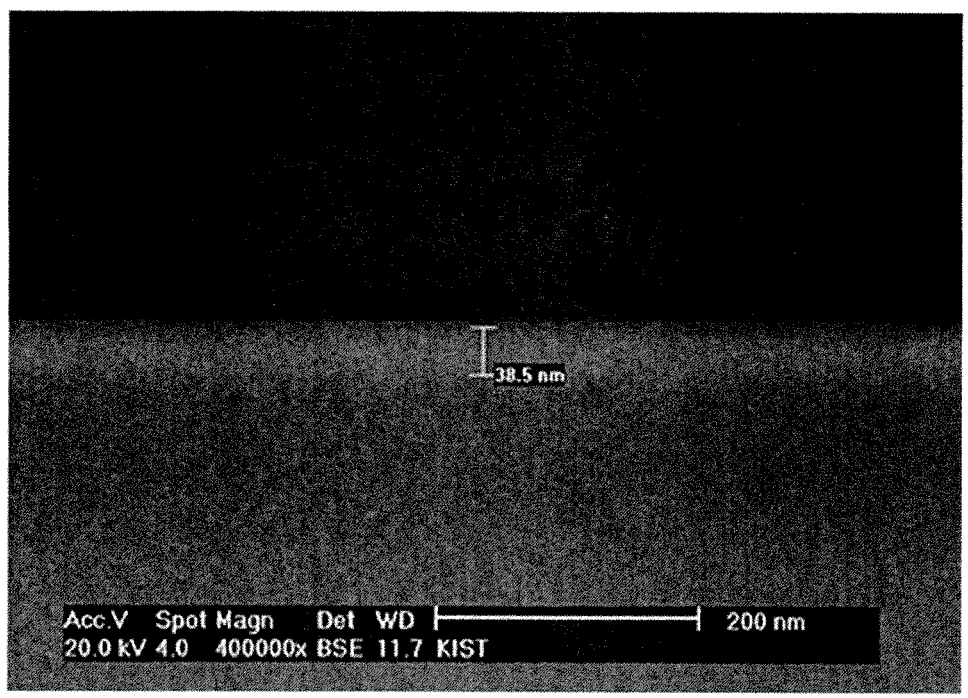
FIG. 2 provides the cross-sectional SEM photograph of the thin film transistor according to Example 2.

FIG. 2 provides a SEM photograph of the cross-sectional view of the thin film transistor according to Example 2.

As shown in FIG. 2, a metal oxide layer used for a semiconductor layer is about 40 nm thick.

Structure Change of Metal Oxide Layer

Figure 3:
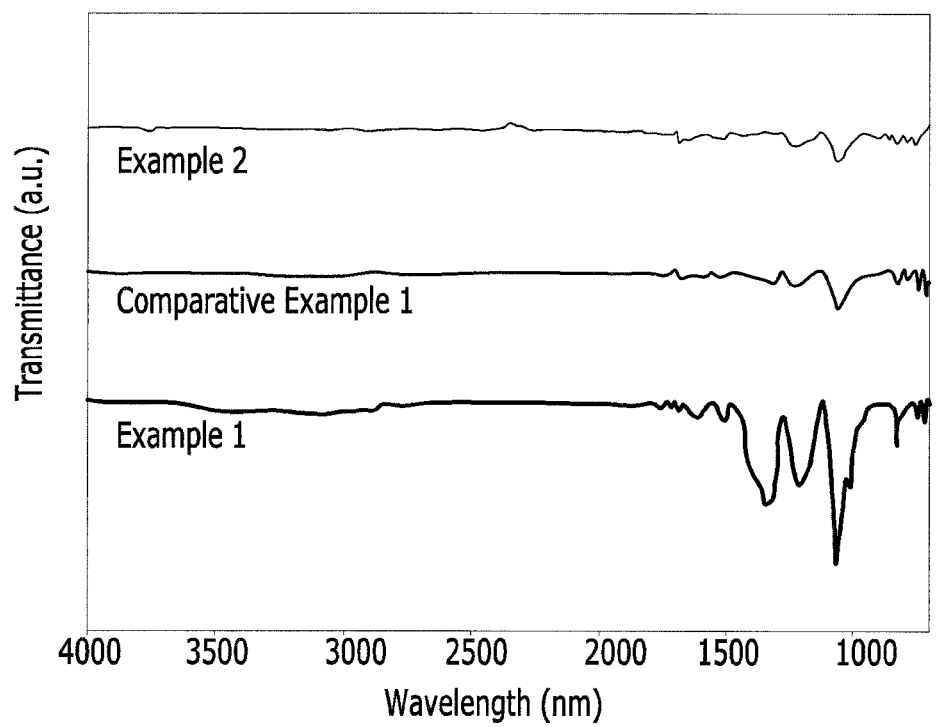
FIG. 3 shows attenuated total reflection (ATR) Fourier transform infrared spectroscopy (FT-IR) analysis results of the ink composition according to Example 1 and of the semiconductor layers according to Example 2 and Comparative Example 1.

FIG. 3 shows attenuated total reflection (ATR) and Fourier transform infrared spectroscopy (FT-IR) analysis results of the ink composition according to Example 1, the semiconductor layer according to Example 2, and a semiconductor layer according to Comparative Example 1.

Referring to FIG. 3, the ATR FT-IR curved line of the ink composition according to Example 1 and the ATR FT-IR curved line of the photosintered semiconductor layer according to Example 2 are compared with the ATR FT-IR curved line of the semiconductor layer heat-treated at 500° C. according to Comparative Example 1. Both of Examples 1 and 2 are preheated at 80° C.

The ink composition according to Example 1 has a broad peak ranging from about 3000 to about 3500 cm$^{-1}$ due to the stretching vibration of O—H. The carbonyl group of Zn(O-COCH$_3$)$_2$ has peaks at about 1613 cm$^{-1}$ and 1520 cm$^{-1}$. There is a strong peak at 1380, 1333, 1218, and 1060 cm$^{-1}$ due to an organic group in the ion ink. Specifically, these peaks may be caused by a nitrate group in the two In(NO$_3$)$_3$.3H$_2$O and Ga(NO$_3$)$_3$.3H$_2$O precursors. In addition, water molecules in the above three hydrate-typed precursors may absorb light.

These peaks may be remarkably decreased or disappear after the sintering with a short-pulsed white light and the heat treatment (thermal sintering) referring to Example 2 and Comparative Example 1 in FIG. 3.

X-Ray Diffraction Analysis

Figure 4:
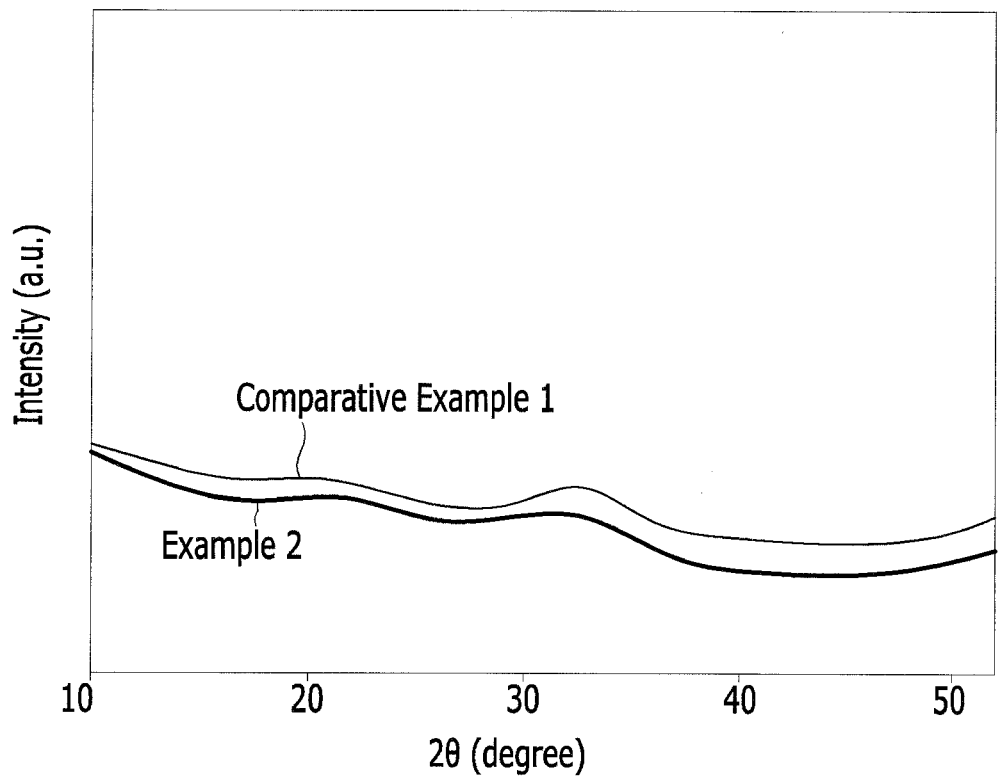
FIG. 4 is a graph showing the X-ray diffraction pattern of the metal oxide layers according to Example 2 and Comparative Example 1.

FIG. 4 shows a graph showing the X-ray diffraction pattern of the metal oxide layers according to Example 2 and Comparative Example 1.

The analysis is performed under the following conditions.
XRD equipment: D/Max-2500, Rigaku
scan speed: about 4°/min
scan range: about 10 to about 150°
target: Cu
Cu KAlpha1=about 1.54056 Å
Cu KAlpha2=about 1.54439 Å

Examples show a broad amorphous peak around about 2θ=33°, while Comparative Example 1 shows a little stronger peak due to movement time of molecules. Accordingly, the sintering with a short-pulsed white light may maintain the amorphous state of a composition.

Characteristic Evaluation of Thin Film Transistor

Figure 5:
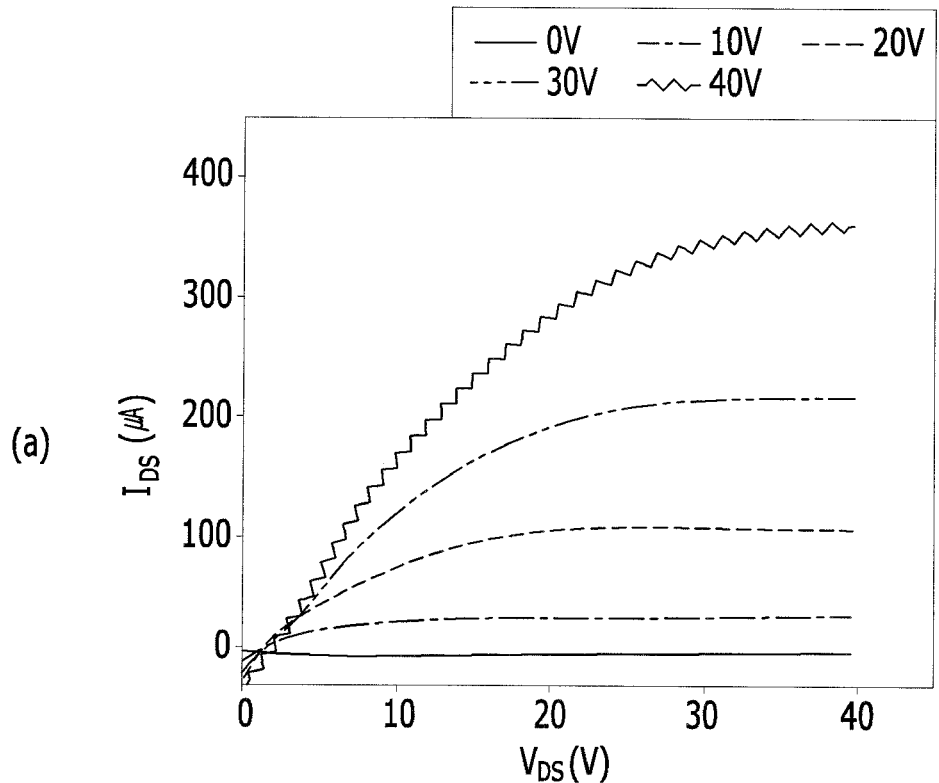
FIG. 5 is a graph showing output and transfer characteristics of the thin film transistor according to Example 2.
Figure 5:
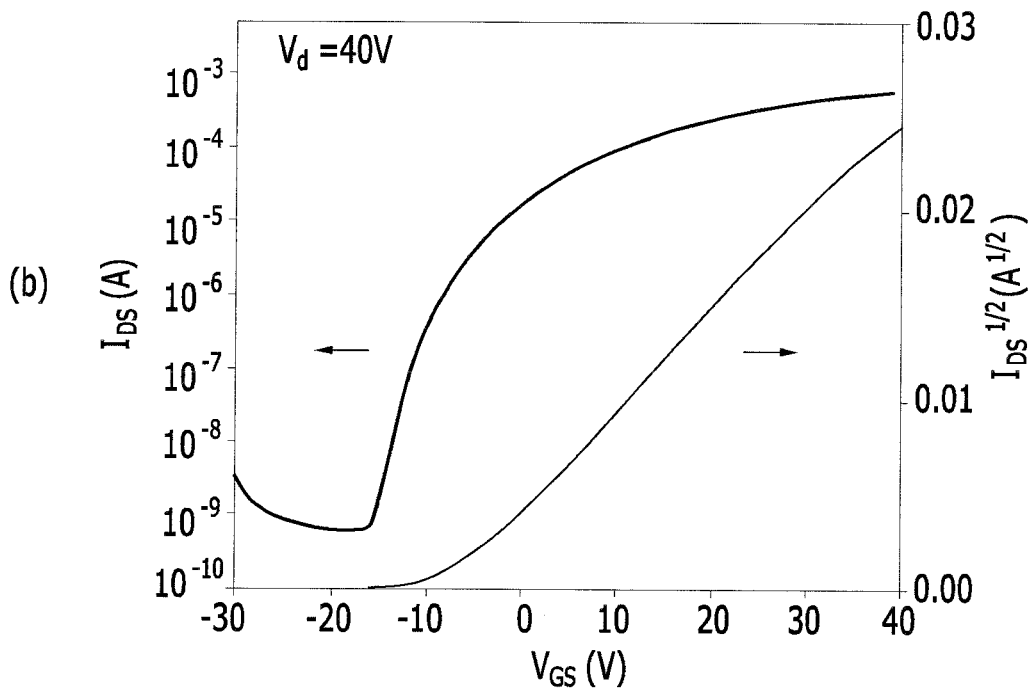

FIG. 5 is a graph showing output and transfer characteristics of the thin film transistor according to Example 2.

As shown in (a) of FIG. 5, the active layer in thin film transistor turns out to be an n-type semiconductor through the analysis of a curved line between a drain current and a drain-source voltage.

In addition, the device is measured regarding the transfer characteristic at a drain voltage $V_{DS}$=40 V. As a result, the device has mobility of about 1.17 cm$^2$V$^{-1}$ s$^{-1}$.

Furthermore, the device sintered with a short-pulsed white light accomplishes an on-off ratio of about 10$^6$.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments are exemplary in every way but are not limiting.

What is claimed is:

1. A method for patterning a metal oxide, comprising:
   preparing an ink composition including at least one metal oxide precursor or one metal oxide nanoparticle, and a solvent;
   ejecting the ink composition onto a substrate to form a pattern on the substrate; and
   photosintering the formed pattern;
   wherein the metal oxide precursor is ionic.

2. The method of claim 1, which further comprises preheating the pattern at a temperature ranging from about 50 to about 400° C. before the photosintering.

3. The method of claim 1, wherein the ink composition comprises the metal oxide nanoparticle.

4. The method of claim 1, wherein the ion ink composition further comprises a solution stabilizer.

5. The method of claim 4, wherein the solution stabilizer comprises diketone, amino alcohol, polyamine, ethanol amine, diethanol amine, or a combination thereof.

6. The method of claim 1, wherein the solvent comprises water, tetrahydrofuran (THF), an alcohol-based solvent, an ether-based solvent, or a combination thereof.

7. The method of claim 1, wherein the metal oxide precursor is a metal inorganic salt including a metal selected from lithium (Li), sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), bismuth (Bi), and a combination thereof.

8. The method of claim 7, wherein the metal inorganic salt has an anion such as a hydroxide ion, an acetate ion, a propionate ion, an acetylacetonate ion, a 2,2,6,6-tetramethyl-3,5-heptanedionate ion, a methoxide ion, a sec-butoxide ion, a t-butoxide ion, an n-propoxide ion, an i-propoxide ion, an ethoxide ion, a phosphate ion, an alkylphosphate ion, a nitrate ion, a perchlorate ion, a sulfate ion, an alkylsulfonate ion, a phenoxide ion, a bromide ion, an iodide ion, a chloride ion, or a combination thereof.

9. The method of claim 3, wherein the ink composition further comprises a polymer binder.

10. The method of claim 9, wherein the polymer binder is poly(vinylpyrrolidone) (PVP), polyacrylate, polyethylene glycol, cellulose acetate, or a combination thereof.

11. The method of claim 3, wherein the metal oxide nanoparticle comprises a metal such as lithium (Li), sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), bismuth (Bi), or a combination thereof.

12. The metal oxide of claim 1, wherein the photosintering is performed by using a short-pulsed white light.

13. The method of claim 12, wherein the white light has a short pulse lasting for about 1 to about 500 ms and paused for about 0.1 to about 500 ms, and has a pulse number ranging from about 1 to about 99 or pulse energy ranging from about 5 to about 200 J/cm$^2$.

14. A method of manufacturing a thin film transistor, comprising:
    depositing a gate dielectric layer on a gate electrode and a substrate;
    depositing an oxide semiconductor layer on the gate dielectric layer;
    depositing a conductive layer on the oxide semiconductor layer; and
    etching the conductive layer to define source and drain electrodes and an active channel;
    wherein the deposition of an oxide semiconductor layer on a gate dielectric layer comprises:
    preparing a first ink composition comprising at least one first metal oxide precursor or one first metal oxide nanoparticle, and a first solvent; forming a semiconductor layer on a gate dielectric layer by ejecting the first ink composition onto the gate dielectric layer; and photosintering the oxide semiconductor layer, and
    the first metal oxide precursor is ionic.

15. The method of claim 14, wherein the deposition of a gate dielectric layer on a gate electrode and a substrate comprises:
    preparing a second ink composition including at least one second metal oxide precursor or second metal oxide nanoparticle, and a second solvent;
    forming a gate dielectric layer on the gate electrode and the substrate by ejecting the second ink composition onto the gate electrode and the substrate; and
    photosintering the gate dielectric layer;
    wherein the second metal oxide precursor is ionic.

16. The method of claim 14, wherein the gate dielectric layer is preheated at a temperature ranging from about 50 to about 400° C. before the photosintering.

17. The method of claim 15, wherein the oxide semiconductor layer is preheated at a temperature ranging from about 50 to about 400° C. before the photosintering.

18. The method of claim 14 or 15, wherein the first ink composition comprises a first metal oxide nanoparticle, and the second ink composition comprises a second metal oxide nanoparticle.

19. The method of claim 14 or 15, wherein the photosintering of the gate dielectric layer or the oxide semiconductor layer is performed by using a short pulsed white light.

* * * * *